United States Patent
Tsuruma

(10) Patent No.: US 6,919,169 B2
(45) Date of Patent: Jul. 19, 2005

(54) METHOD OF PRODUCING A LIQUID EJECTION HEAD

(75) Inventor: Isao Tsuruma, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/829,961

(22) Filed: Apr. 23, 2004

(65) Prior Publication Data

US 2004/0212661 A1 Oct. 28, 2004

(30) Foreign Application Priority Data

Apr. 25, 2003 (JP) ........................................ 2003-120931

(51) Int. Cl.[7] .................................................. B41J 2/06
(52) U.S. Cl. ........................................ 430/320; 347/55
(58) Field of Search ................................ 430/320, 325; 347/55

(56) References Cited

U.S. PATENT DOCUMENTS

| | | | | |
|---|---|---|---|---|
| 5,915,763 A | * | 6/1999 | Masuda | ...................... 29/890.1 |
| 6,076,918 A | * | 6/2000 | Shima et al. | .................. 347/55 |
| 6,092,889 A | | 7/2000 | Nakamoto et al. | |
| 6,158,844 A | | 12/2000 | Murakami et al. | |

FOREIGN PATENT DOCUMENTS

| | | | | |
|---|---|---|---|---|
| EP | 0 822 075 A | * | 2/1998 |
| JP | 9-76505 A | | 3/1997 |
| JP | 10-230607 A | | 9/1998 |
| JP | 2000-025237 A | * | 1/2000 |

* cited by examiner

*Primary Examiner*—John A. McPherson
(74) *Attorney, Agent, or Firm*—Sughrue Mion, PLLC

(57) ABSTRACT

The present invention provides a method of producing a liquid ejection head having a solution guide member protruding on a head substrate. The solution guide member has a sharp-pointed portion protruding from a liquid surface of a flowing solution in which charged particles are dispersed. The solution guide member guides the solution to the sharp-pointed portion such that the solution is ejected from the sharp-pointed portion by an electrostatic force. The method comprises the steps of forming a photosensitive resin layer on the head substrate; molding a convex portion having the sharp-pointed portion on a surface of the formed photosensitive resin layer by pressing a mold member against the surface of the photosensitive resin layer; and exposing a region of the molded convex portion; and developing the exposed photosensitive resin layer to produce the solution guide member provided on the head substrate.

11 Claims, 16 Drawing Sheets

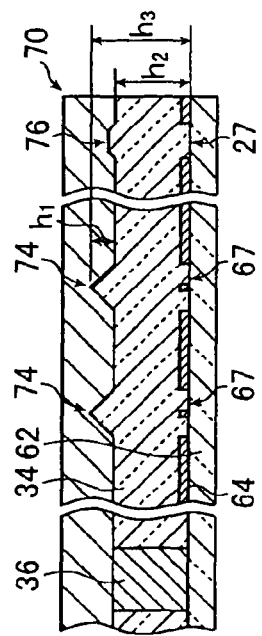
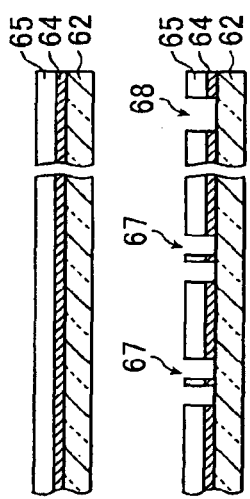
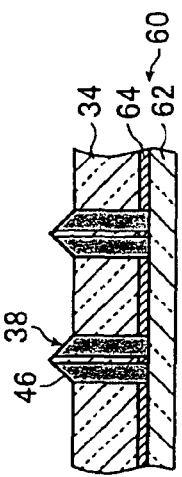
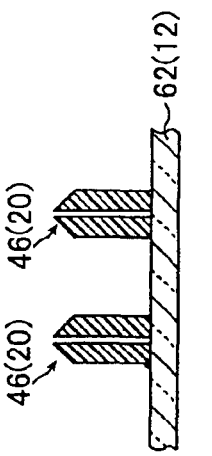
FIG. 7A
FIG. 7B
FIG. 7C
FIG. 7D
FIG. 7E
FIG. 7F
FIG. 7G
FIG. 7H
FIG. 7I

METHOD OF PRODUCING A LIQUID EJECTION HEAD

BACKGROUND OF THE INVENTION

1. Field of the Invention

The present invention relates to a method of producing a liquid ejection head that ejects a solution, in which charged particles are dispersed in a solvent, by means of an electrostatic force.

2. Description of the Related Art

Nowadays, a thermal-type ink jet head that ejects an ink droplet by means of an expansive force of a bubble generated in ink under heating and a piezo-type ink jet head that ejects an ink droplet by giving a pressure to ink using a piezoelectric element have been proposed. In the case of the thermal-type ink jet head, the ink is partially heated to 300° C. or higher, so that a problem arises in that a material for the ink is limited. Also, in the case of the piezo-type ink jet head, there is a problem in that its construction is complicated and an increase in cost is inevitable. As an ink jet head that solves those problems, a liquid ejection head is proposed which ejects a solution, in which charged particles are dispersed, by means of an electrostatic force (see JP 10-230607 A or JP 09-76505 A, for instance).

FIG. 17 is a schematic structural diagram of an example of an ink ejection means of an image recording apparatus disclosed in JP 10-230607 A. The ink ejection means 100 includes: a head substrate 102; an individual electrode 104 provided on the head substrate 102 so as to upwardly protrude, in which at least a surface of the individual electrode 104 has conductivity and a voltage is applied to the surface; an upper cover 106 having a construction where an upper cover through hole 106a is formed therein so as to correspond to the arrangement position of the individual electrode 104 and at least a tip end of the individual electrode 104 protrudes from the upper cover through hole 106a; and a counter electrode 110 provided in front of the tip end of the individual electrode 104, in which a recording medium 108 is arranged on a surface of the counter electrode 110. The individual electrode 104 has a notch formed as an ink guide groove 103 in a vertical direction in the drawing and functions as an ink guide that guides ink to a tip end side. The tip end of the individual electrode 104 is sharply pointed in a tapered shape having inclined surfaces and is set as a position at which an ink droplet is caused to fly.

The head substrate 102 and the upper cover 106 are arranged apart from each other by a predetermined distance and an ink 112, in which charged coloring material component particles (charged particles) are dispersed, is circulated in a gap between the head substrate 102 and the upper cover 106. The individual electrode 104 is set so that at least its tip end passes through the upper cover through hole 106a and protrudes toward a side of the counter electrode 110. A part of the ink 112 moves along the ink guide groove 103 by means of a capillary phenomenon and reaches the ink droplet ejection position. At the same time, the charged particles in the ink 112 also reach the ink droplet ejection position.

Here, if the charged particles are positively charged, voltages are applied to the individual electrode 104 and the counter electrode 110 so that the individual electrode 104 assumes a high potential and the counter electrode 110 takes a low potential. Also, if the charged particles are negatively charged, the voltage application is performed so that the individual electrode 104 assumes a low potential and the counter electrode 110 takes a high potential. As a result of the voltage application, an electric field is formed between the individual electrode 104 and the counter electrode 110 and charged particles existing at the ink droplet ejection position are attracted toward the counter electrode 110 side. As a result, an ink droplet containing the charged particles is ejected from the ink droplet ejection position toward the counter electrode 110. As disclosed in JP 10-230607 A, the ink ejected in this manner is caused to adhere onto the recording medium 108.

Here, in order to eject a smaller ink droplet with stability and efficiency, it is desired that the individual electrode 104 functioning as an ink guide member have a thinner and more pointed tip end. Also, in order to eject the liquid from multiple liquid ejection heads with stability, high density, and high precision, it is desired that an aspect ratio of the ink guide members (ratio of the height of the ink guide members to a cross section or breadth thereof) is increased and the ink guide members are provided on the head substrate with high density and high precision. Further, it is desired to uniformly form the sharp-pointed portions of the ink guide members. That is, it is desired to produce ink guide members, which each have a sharp-pointed portion and have a high aspect ratio, with high density and high precision as well as uniformly.

As a method of producing such ink guide members, JP 10-230607 A described above discloses a production method with which molding is performed using a plastic resin and multiple rows of ink guide members are arranged at predetermined pitches and intervals (see paragraphs [0016] and [0023] of JP 10-230607 A).

Also, as another method, JP 09-76505 A discloses a production method utilizing an Si semiconductor microprocessing technique. The outline of the ink guide member production method disclosed in JP 09-76505 A will be described below with reference to FIGS. 18A to 18G.

FIGS. 18A to 18G each shows a step of the ink guide member production method disclosed in JP 09-76505 A that utilizes the Si semiconductor microprocessing technique. First, as shown in FIG. 18A, a thermal oxidation layer 204 is formed on a surface of an Si single crystal substrate 202 and a resist layer 206 is formed on the thermal oxidation layer 204. Next, as shown in FIG. 18B, the resist layer 206 is patterned through exposure, development, and the like so as to have a mask pattern in a square shape or the like on the surface and the thermal oxidation layer 204 is etched using the resist layer 206 as a mask. Next, as shown in FIG. 18C, after the resist layer 206 is removed, the Si single crystal substrate is subjected to anisotropic etching and a concave portion 205 having an inverted-pyramid shape is formed. Next, as shown in FIG. 18D, the thermal oxidation layer 204 is removed once, and then another thermal oxidation layer 208 is formed on the entire surface. Next, a line-shaped convex portion 207 is formed on the inner surface of the concave portion 205 of the thermal oxidation layer 208 by vapor deposition using glass or the like. Next, as shown in FIG. 18E, an electric conductor is selectively sputtered using a selection mask (not shown) and an electrode layer 210 is formed so as to fill the inside of the concave portion 205. Then, as shown in FIG. 18F, a glass substrate 220 is bonded to the electrode layer 210 using an electrostatic bonding method or the like. Finally, as shown in FIG. 18G, the Si single crystal substrate 202 is etched and removed, thereby obtaining an ink guide member 200 that has a sharp-pointed tip end and ink guide grooves 214 that guide ink to the tip end on side surfaces.

With this production method, the concave portion is formed through patterning using photolithography at a time, so that it is possible to produce multiple ink guide members having high precision of position on the substrate. Also, the anisotropic etching of the Si single crystal substrate is utilized at the time of the formation of the concave portion, so that it is possible to form ink guide members having high precision, uniformity, and reproducitivity.

With the above-mentioned production method disclosed in JP 10-230607 A with which a plastic resin is cast-molded using a separately produced mold and the solidified plastics are pulled out of the mold, however, if a molded structure has a high aspect ratio, there arises a problem in that the plastics cannot be pulled out of the mold and is broken, which makes it impossible to perform molding into a desired shape. Therefore, it is difficult to produce ink guide members having a high aspect ratio. Also, with this method, it is required to arrange the multiple molded ink guide members on the substrate while increasing precision of position. However, a degree, to which the precision of arrangement of the ink guide members can be increased, is limited. In addition, there is another problem in that a large number of process steps are required in order to arrange the ink guide members.

Also, with the production method disclosed in JP 09-76505 A that utilizes the Si semiconductor microprocessing technique as described above, the electrode layer 210 is formed with the sputtering method using the selection mask, so that it is required to form a film having a certain thickness. However, such a thick film tends to be distorted or warped due to a stress or the like. Therefore, it is difficult to form the film in a desired shape. Also, when a film having a certain thickness is to be selectively formed using the selection mask, it is required to space the mask apart from the substrate in accordance with the thickness of the film to be formed. Therefore, a degree of widening of the cross-sectional shape of the electrode layer 210 with respect to the opening of the selection mask increases as the thickness of the electrode layer 210 functioning as the ink guide member is increased, which makes it impossible to form an electrode layer having a high aspect ratio. Consequently, it is impossible to form an ink guide member having a high aspect ratio. Also, with this method, there is another problem in that the design flexibility of the shape of the electrode layer 210 is low, the process steps become complicated, and an increase in cost is inevitable.

SUMMARY OF THE INVENTION

The present invention has been made in order to solve the problems described above and has an object to provide a method of producing a liquid ejection head that includes solution guide members, such as ink guide members, each of which has a sharp-pointed portion protruding from a liquid surface of a solution, in which charged particles are dispersed, and causes a droplet to fly from the sharp-pointed portion by means of an electrostatic force, the method enabling to form the solution guide members so as to have a high aspect ratio (i.e., a height of the solution guide members is greater than a breadth thereof) with high density and high precision and to achieve high productivity.

The invention provides a method of producing a liquid ejection head including a solution guide member that is a protrusion member provided on a head substrate and has a tip end that is a sharp-pointed portion protruding from a liquid surface of a solution in which charged particles are dispersed and which flows on the head substrate, the solution guide member guiding the solution to the sharp-pointed portion such that the solution is ejected from the sharp-pointed portion by means of an electrostatic force. The method comprises: forming a photosensitive resin layer on the head substrate; molding a convex portion having the sharp-pointed portion on a surface of the formed photosensitive resin layer by pressing a mold member against the surface of the photosensitive resin layer; exposing one of a first region and a second region of the photosensitive resin layer by irradiation of light wherein the first region includes a region in which the convex portion has been molded and the second region includes a peripheral region surrounding the region of the molded convex portion; and developing the exposed photosensitive resin layer to produce the solution guide member provided on the head substrate.

The mold member may comprise a mold substrate produced by forming a concave portion corresponding to the convex portion on a surface of a single crystal substrate, the concave portion obtained by anisotropic etching.

The exposure of the photosensitive resin layer may be performed by irradiating the photosensitive resin layer with light from a side on which the mold member is pressed against the photosensitive resin layer and the convex portion is molded. Then, the exposure of the photosensitive resin layer is preferably performed by forming a matching oil layer on a surface of the photosensitive resin layer and bringing an exposure mask having a predetermined pattern shape into contact with the matching oil layer.

The mold member against the surface of the photosensitive resin layer may have V-groove shaped concave on a surface of the mold member.

The head substrate may have transparency and the exposure of the photosensitive resin layer may be performed by irradiating the photosensitive resin layer with light through the head substrate from a surface of the head substrate on a side opposite to a surface thereof on which the photosensitive resin layer has been formed. Then, the exposure of the photosensitive resin layer is preferably performed using an exposure mask which is formed on the head substrate.

The mold member may comprise a mold film that is a resin film having a surface on which a concave portion corresponding to the convex portion has been formed. Then, the mold film may have transparency and the exposure of the photosensitive resin layer may be performed by irradiating the photosensitive resin layer with light through the mold film in a state where the mold film used to mold the convex portion remains. Then, the exposure of the photosensitive resin layer is preferably performed using an exposure mask which is disposed on the mold film.

The method of the invention preferably produces the liquid ejection head, wherein the head substrate has plural solution guide members arrayed two dimensionally thereon and the solution guide members are simultaneously produced through the molding, the exposing and the developing.

BRIEF DESCRIPTION OF THE DRAWINGS

In the accompanying drawings:

FIGS. 7A to 7I are explanatory diagrams of the ink guide member production method that is the second embodiment of the ink ejection head production method according to the present invention, and are respectively cross-sectional views as viewed from a direction that is different from that in FIGS. 6A to 6I;

DETAILED DESCRIPTION OF THE PREFERRED EMBODIMENTS

Figure 1:
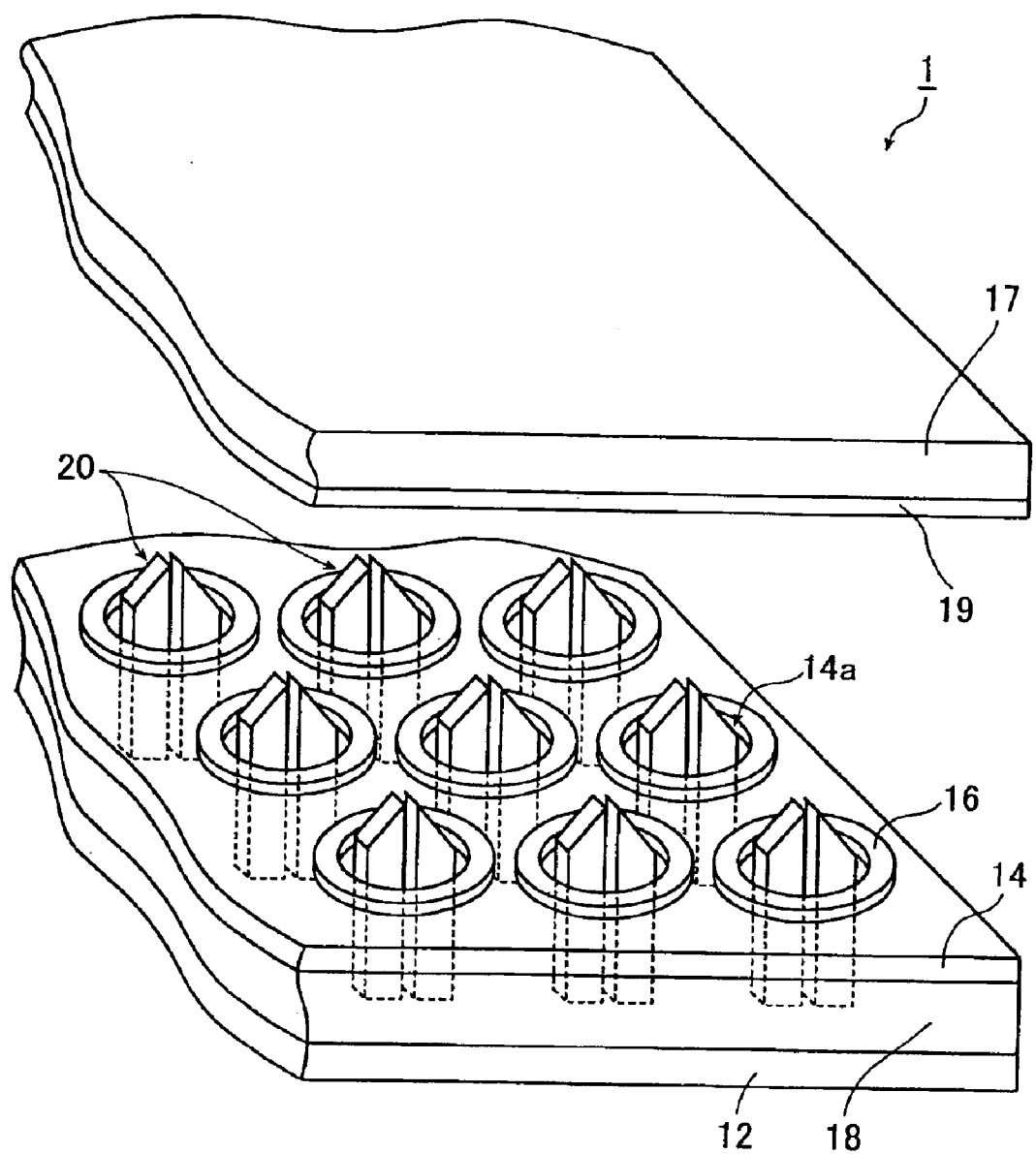
FIG. 1 is a schematic perspective view of an ink ejection head that is an embodiment of a liquid ejection head produced with a liquid ejection head production method according to the present invention.

A liquid ejection head production method of the present invention will now be described based on embodiments illustrated in the accompanying drawings. FIG. 1 is a schematic perspective view of an ink ejection head 1 that is an embodiment produced with the liquid ejection head production method of the present invention. As shown in FIG. 1, the ink ejection head 1 includes a head substrate 12, an upper cover 14, drive electrodes 16, a counter electrode 17, and ink guide members 20. Also, ink 18 is circulated in a gap between the head substrate 12 and the upper cover 14 and a recording medium 19, on which a liquid is ejected and a predetermined image or the like is recorded, is placed on the counter electrode 17.

As shown in FIG. 1, the multiple ink guide members (solution guide members) 20 are regularly and two dimensionally arranged at predetermined positions on the head substrate 12. Also, the upper cover 14 is arranged so as to be spaced apart from the head substrate 12 by a certain distance and upper cover through holes 14a are established in the upper cover 14 at positions corresponding to the respective ink guide members 20 on the head substrate 12. The ink guide members 20 having sharp-pointed portions 24 (see FIG. 2) produced by sharply pointing the tip ends thereof partially protrude from the upper cover through holes 14a. Also, the ring-shaped drive electrodes 16 are provided on a surface of the upper cover 14 so as to surround the peripheries of the upper cover through holes 14a. The ink 18, in which the charged coloring material component particles are dispersed, is circulated in a gap between the head substrate 12 and the upper cover 14 by an ink circulation mechanism (not shown) such as a pump, thereby creating an ink flow. This ink 18 is a solution where positively charged coloring material component particles are dispersed in an insulative solvent having a resistivity of $10^8$ Ωcm or more together with a charge control agent, a binder, and the like. In FIG. 1, above the ink guide members 20 and the upper cover 14, the counter electrode 17 is arranged in front of the sharp-pointed portions 24 of the ink guide members 20 protruding from the upper cover through holes 14a, and the recording medium 19, such as recording paper, is placed on a surface of the counter electrode 17.

Figure 2:
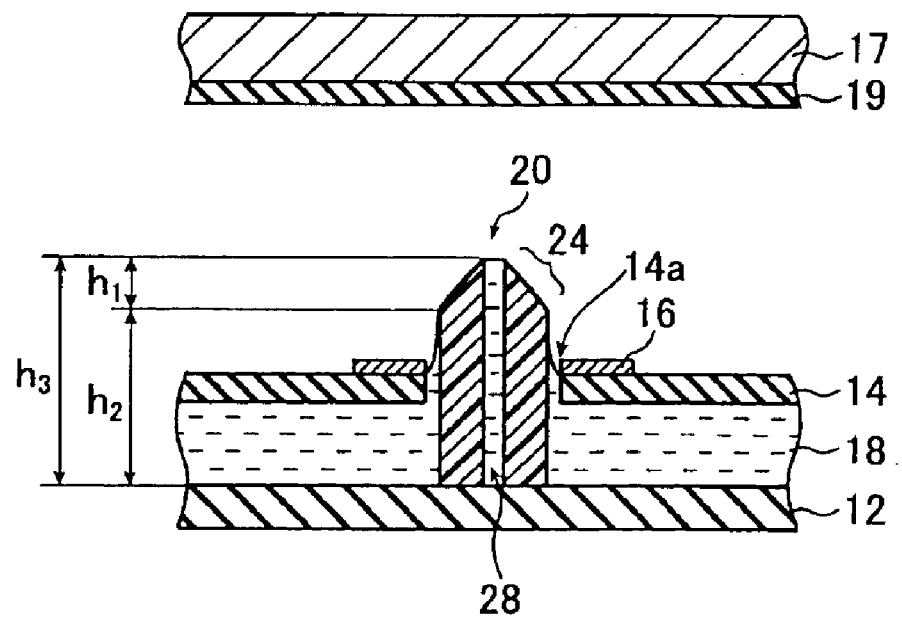
FIG. 2 is a schematic cross-sectional view showing a construction on the periphery of an ink guide member in the ink ejection head shown in FIG. 1.
Figure 3:
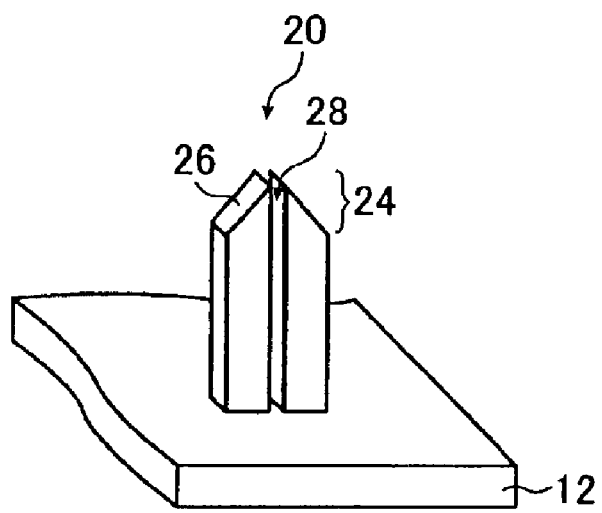
FIG. 3 is a schematic perspective view showing a shape of the ink guide member in the ink ejection head shown in FIG. 1.

FIG. 2 is a schematic cross-sectional view where one of the multiple ink guide members 20 produced with the liquid ejection head production method of the present invention is enlarged and illustrated. Also, FIG. 3 is a schematic perspective view of the ink guide member 20 shown in FIG. 2. As shown in FIGS. 2 and 3, the ink guide member 20 has the sharp-pointed portion 24 and an ink guide groove 28.

The head substrate 12 is an insulative substrate, such as a glass substrate, and the ink guide member 20, whose tip end is a triangular convex-shaped and sharp-pointed portion 24 with a height $h_1$ and whose overall height is $h_3$, is formed on the head substrate 12. The extreme tip end portion of the ink guide member 20 is sharply pointed so that the sharp-pointed portion 24 has inclined surfaces 26 whose cross section taken along a plane orthogonal to a direction from the head substrate 12 to the tip end is reduced as a distance from the head substrate 12 is increased and a distance to the tip end is decreased. At the center of the ink guide member 20, the ink guide groove 28 is provided which is a notch formed so as to pass through from the head substrate 12 to the tip end. A portion of the ink guide member 20 from the head substrate 12 until the sharp-pointed portion 24 having a height $h_2$ functions as a base portion whose side surfaces are formed so as to be approximately vertical to the head substrate 12. As shown in FIG. 2, above the head substrate 12, the upper cover 14 made of an insulative substrate, such as a glass substrate, is arranged so as to be spaced apart from the head substrate 12 by a predetermined distance. Note that the ink guide member 20 itself is made of an insulative photosensitive resin material.

Here, a liquid ejection operation of the liquid ejection head in this embodiment will be described with reference to FIG. 2. For instance, when positively charged particles are dispersed in the ink 18 circulated in the gap between the head substrate 12 and the upper cover 14, the ink 18 moves along the ink guide groove 28 from the head substrate 12 throughout the tip end by means of a capillary phenomenon and upwardly moves until the sharp-pointed portion 24 of the ink guide member 20.

Here, the counter electrode 17 is set to the ground and a voltage application device (not shown) applies a voltage to the drive electrode 16 provided around a desired ink guide member 20 so that the drive electrode 16 assumes a high potential. As a result of this voltage application, an electric field is generated between the drive electrode 16 and the counter electrode 17, and the charged particles in the solution existing in the sharp-pointed portion 24 receives an electrostatic force, are pulled toward the counter electrode 17 side, and are ejected toward the counter electrode 17 as a droplet. The coloring material component particles that are the ejected charged particles adhere to a surface of the recording medium 19 arranged on the counter electrode 17.

According to this embodiment, the ink guide member 20 has the sharp-pointed portion 24 produced by sharply pointing its extreme tip end portion, so that it becomes possible to cause the charged particles to fly from the sharp-pointed portion 24 as a small droplet with stability. Also, by concentrating the electric field in the extremely tip end portion, it becomes possible to reduce the application electric field required to cause the ejection. As a result, it becomes possible to achieve an improvement in a margin of voltage-proof of the electric circuit and a reduction in cost of a control apparatus.

In this embodiment, the multiple ink guide members 20 are arranged and a voltage is applied to the drive electrode 16 surrounding a desired ink guide member 20, so that it becomes possible to eject the ink as an ink droplet from the sharp-pointed portion 24 of the desired ink guide member 20 as described above. According to the present invention, the ink guide members 20 having a high aspect ratio construction, in which the breadth or cross section thereof is reduced as much as possible, are arranged with high density and high precision and ink droplets are ejected with high density and high precision. As a result, it becomes possible to record an image on the recording medium 19 with high density and high definition.

The ink ejection head 1, in which the ink guide members 20 having such a high aspect ratio and including tip ends having a high precise sharp-pointed shape are arranged on the head substrate 12 with high density, is produced in a manner described below.

FIGS. 4A to 4G and FIGS. 5A to 5G are explanatory diagrams of an ink guide member production method that is a first embodiment of the ink ejection head production method of the present invention. FIGS. 4A to 4G are plan views taken from above a substrate surface of the insulative substrate on which the ink guide members are to be produced. Also, FIGS. 5A to 5G are cross-sectional views taken along the line V–V' in FIGS. 4A to 4G, containing the insulative substrate during production, and each corresponding to one of FIGS. 4A to 4G.

Figure 4A:
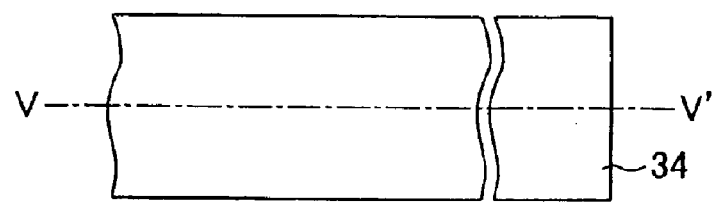
FIGS. 4A to 4G are explanatory diagrams of an ink guide member production method that is a first embodiment of the ink ejection head production method according to the present invention.
Figure 5A:
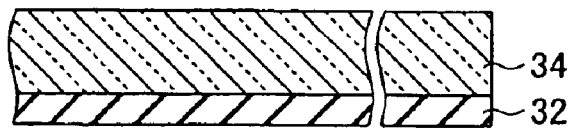
FIGS. 5A to 5G are explanatory diagrams of the ink guide member production method that is the first embodiment of the ink ejection head production method according to the present invention, and are respectively cross-sectional views as viewed from a direction that is different from that in FIGS. 4A to 4G.

First, as shown in FIG. 5A, an insulative substrate 32, such as a glass substrate, is prepared and a photosensitive resin material, such as NANO SU-8 manufactured by Micro-Chem Corp., is applied onto a surface of the insulative substrate 32 with a spin coat method so as to form a film having a thickness of $h_3$ or more (200 μm to 1 mm, for instance). Following this, the whole of the product is heated to a temperature, e.g., 50 to 90° C. or higher, using a hot plate or a clean oven and a solvent is removed. As a result, as shown in FIGS. 4A and 5A, a photosensitive resin layer 34 that is a thick film is formed. The following description will be made by assuming that the photosensitive resin material used in this embodiment is a negative-type resist where each exposed portion is cross-linked.

Figure 4B:
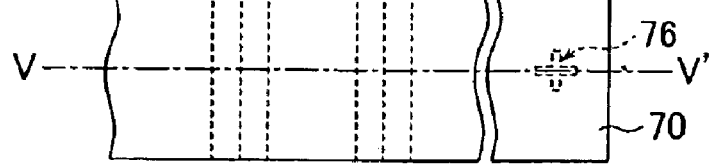
Figure 5B:
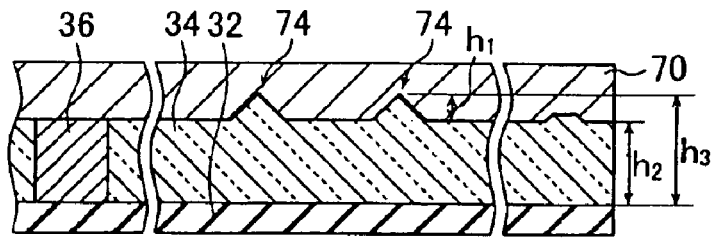
Figure 10A:
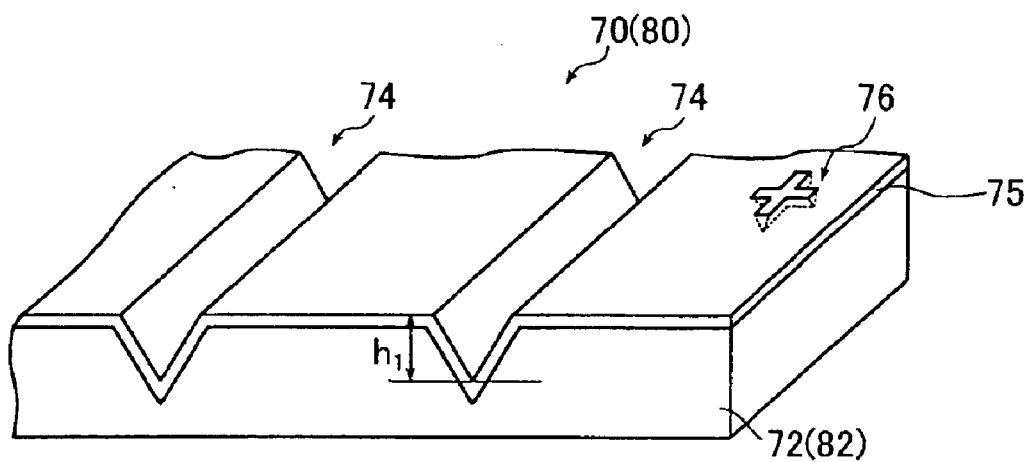
FIGS. 10A and 10B are schematic structural diagrams showing an example of a mold member used with the ink ejection head production method according to the present invention.

Next, as shown in FIGS. 4B and 5B, a spacer 36 having a height $h_2$ is arranged in a peripheral portion of the substrate and a substrate mold member 70 that is a mold member having V-groove shaped concave portions 74 with a depth of $h_1$ (see FIG. 10A) is arranged on the photosensitive resin layer 34 so that the concave portions 74 oppose a surface of the photosensitive resin layer 34. As shown in FIG. 10A, the substrate mold member 70 used in this embodiment has a construction where a release layer 75 is formed on a surface of the mold substrate 72 on which the concave portions 74 have been formed through anisotropic etching of a surface of an Si single crystal substrate. The substrate mold member 70 used in this embodiment will be described in detail later. Following this, the insulative substrate 32, above which the substrate mold member 70 has been arranged, is set in a hot-press machine and is heated to a temperature, e.g., 50 to 60° C. or higher, that is the transition point of the SU-8 glass, and the substrate mold member 70 is pressed toward the insulative substrate 32 at a pressure, e.g., 0.1 MPa or higher, while deaerating the gap between the substrate mold member 70 and the photosensitive resin layer 34 using a vacuum pump. As a result, the surface of the photosensitive resin layer 34 is molded into a convex shape corresponding to the shape of the concave portions 74 of the substrate mold member 70. At this time, the distance between the substrate mold member 70 and the insulative substrate 32 is regulated by the spacer 36 having the height $h_2$ and a distance from the surface of the insulative substrate 32 to the deepest portion of the V-groove shaped concave portions 74 of the substrate mold member 70 is set to $h_3$. Note that in addition to the V-groove shaped concave portions 74, a desired alignment target formation mark 76 is formed at one predetermined position or more on the surface of the substrate mold member 70 and is also transferred onto the surface of the photosensitive resin layer 34 at the time of molding using the substrate mold member 70.

Figure 4C:
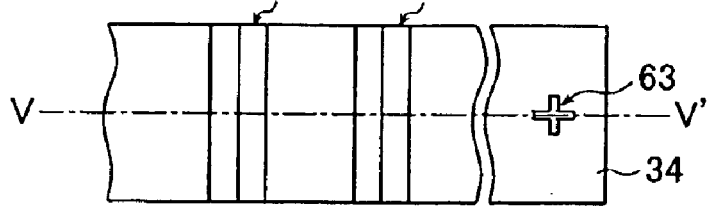
Figure 5C:
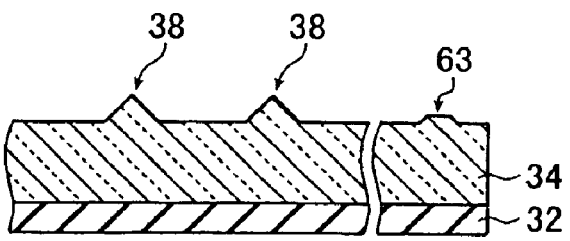

Next, as shown in FIGS. 4C and 5C, the whole of the product is cooled to room temperature, the substrate mold member 70 is detached from the photosensitive resin layer 34, and convex portions 38 having a triangular cross-sectional shape with a height $h_1$ are formed in some areas of the photosensitive resin layer 34 with a thickness of $h_2$. Also, a target mark 63 is formed at one position or more on this surface through the transferring of at least the target formation mark 76 of the substrate mold member 70.

Figure 4D:
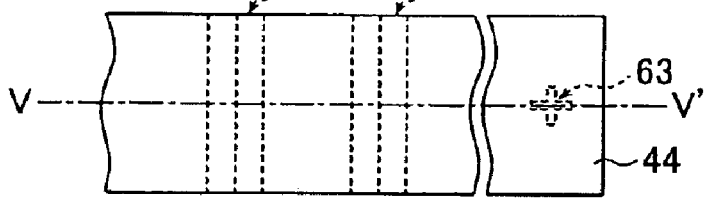
Figure 4E:
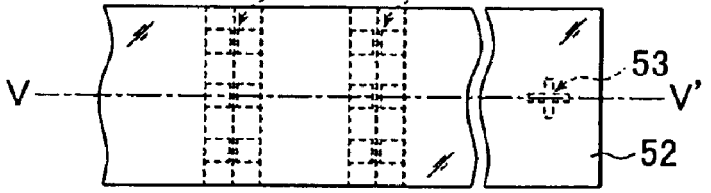
Figure 5D:
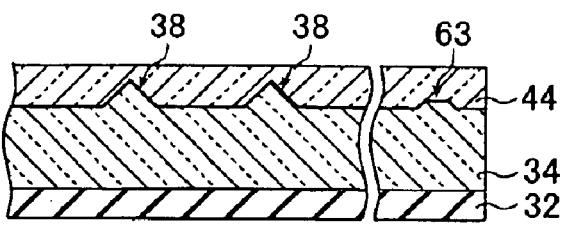
Figure 5E:
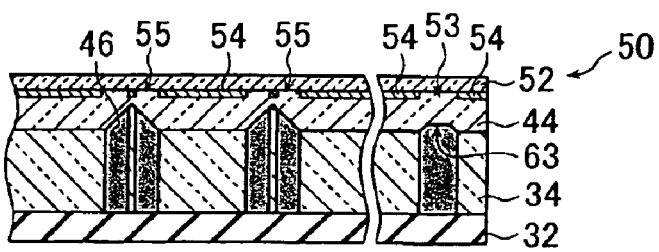

Next, as shown in FIGS. 4D and 5D, a matching oil layer 44 having a refractive index that is approximately equal to that of the photosensitive resin layer 34 is formed on the photosensitive resin layer 34. Following this, as shown in FIGS. 4E and 5E, a photomask 50 produced by forming a light-shielding layer 54 using Cr or the like on a surface of a transparent glass plate 52 is arranged so that the light-shielding layer 54 and the matching oil layer 44 are brought into intimate contact with each other. Here, at each predetermined position of the light-shielding layer 54, an opening pattern 55 having a rectangular shape shown in FIG. 4E is formed. Also, at the time when the photomask 50 is brought into intimate contact with the matching oil layer 44, an alignment key mark 53 formed at a predetermined position of the light-shielding layer 54 of the photomask 50 and the target mark 63 formed on the surface of the photosensitive resin layer 34 are aligned and are positioned/arranged so that the convex portions 38 produced by molding the photosensitive resin layer 34 and the opening patterns 55 of the photomask coincide with each other. Under this state, ultraviolet rays having a wavelength, e.g., 350 to 400 nm, are irradiated onto the whole of the substrate vertical to the surface of the photomask 50 and exposed portions 46 are obtained in accordance with the opening patterns 55. Following this, the whole of the product is heated to a temperature, e.g., 50 to 90° C. or higher, using a hot plate or a clean oven.

Figure 4F:
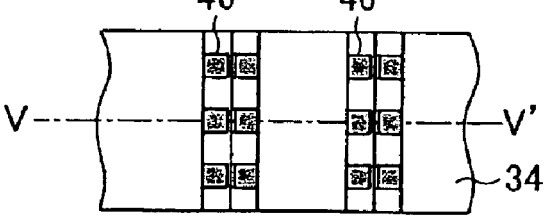
Figure 5F:
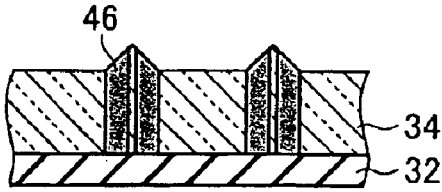

Next, as shown in FIGS. 4F and 5F, the photomask 50 and the matching oil layer 44 are removed and the whole of the product is heated to a temperature, e.g., 50 to 100° C., and the exposed portions 46 of the photosensitive resin layer 34 are hardened. Following this, the insulative substrate 32 is cut into a predetermined size of the ink ejection head through dicing or the like together with the photosensitive resin layer 34 including the exposed portions 46.

Figure 4G:
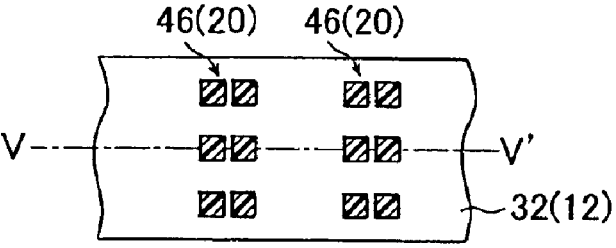
Figure 5G:
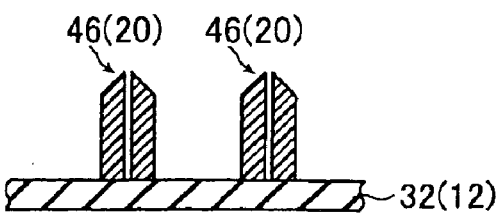

Next, as shown in FIGS. 4G and 5G, the insulative substrate 32 cut together with the photosensitive resin layer 34 forming the surface of the product is immersed in a developing liquid and each unexposed portion of the photosensitive resin layer 34 other than the exposed portions 46 is dissolved. Following this, the whole of the product is cleaned through pure water rinsing and the developing liquid is removed. Then, the exposed portions 46 are subjected to hardening processing at a temperature, e.g., 100 to 200° C., and the ink guide members 20 are obtained.

As a result of the steps described above, the convex-shaped and sharp-pointed portions 24 having the height $h_1$ are provided at the tip ends of the ink guide members 20 on the insulative substrate 32 (head substrate 12) and a construction member is obtained in which the multiple ink guide members 20 having a high aspect ratio (where the overall height including the sharp-pointed portions 24 becomes the height $h_3$) are arranged on the head substrate 12.

As described above, the ink ejection head is produced by providing the upper cover 14 and the counter electrode 17, on whose surface the recording medium 19 is placed, above the head substrate 12, on which the ink guide members 20 have been formed, as shown in FIG. 1.

In this embodiment, at the time when the photosensitive resin layer 34 is partially exposed, the matching oil layer 44 having a refractive index that is approximately equal to that of the photosensitive resin layer 34 is formed on the photosensitive resin layer 34 and a contact exposure method is used with which exposure is performed by bringing the matching oil layer 44 and the photomask 50 into intimate contact with each other. In the above description, the refractive index of the matching oil layer 44 is set approximately equal to that of the photosensitive resin layer 34. With the production method of the present invention, however, the refractive index may be set approximately equal to that of the glass plate 52 of the photomask 50. Also, the photosensitive resin layer 34 may be exposed using a proximity exposure method with which exposure is performed under a state where the matching oil layer 44 is not formed and the photomask 50 is spaced apart by a certain distance, that is, under a state where the photomask 50 is arranged above the photosensitive resin layer 34 through an air layer having a certain thickness. However, in order to suppress the refraction or diffraction of the irradiated ultraviolet rays by the surface of the glass plate 52 or the surface of the photosensitive resin layer 34 with more reliability, to expose the photosensitive resin layer with high precision, and to produce ink guide members having highly precise sharp-pointed portions, it is preferable that the matching oil layer having a refractive index that is approximately equal to that of the photosensitive resin layer is formed and the contact exposure is performed like in this embodiment. Also, if exposure is performed using a projection exposure method, it becomes possible to perform the exposure at predetermined positions and in a predetermined shape even without using the exposure mask and the matching oil.

Also, the production method for the ink ejection head 1 according to the present invention may be as follows.

FIGS. 6A to 6I and FIGS. 7A to 7I are explanatory diagrams of an ink guide member production method that is a second embodiment of the ink ejection head production method of the present invention. FIGS. 6A to 6I are plan views taken from above a substrate surface of the insulative substrate on which the ink guide members are to be produced. Also, FIGS. 7A to 7I are cross-sectional views taken along the line W–W' in FIGS. 6A to 6I, containing the insulative substrate during production, and each corresponding to one of FIGS. 6A to 6I. The same components as in the first embodiment are described below using the same symbols.

Figure 6A:
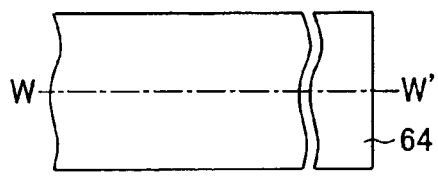
FIGS. 6A to 6I are explanatory diagrams of an ink guide member production method that is a second embodiment of the ink ejection head production method according to the present invention.

First, as shown in FIG. 7A, an insulative substrate 62 having transparency, such as a glass substrate, is prepared. Then, as shown in FIGS. 6A and 7A, a film of Cr or the like is formed as a light-shielding layer 64 on a surface of the insulative substrate 62 through sputtering or the like. Following this, as shown in FIGS. 6B and 7B, a resist layer 65 is formed on the light-shielding layer 64 by spin coating. Here, transparency of the insulative substrate 62 means that at the time of exposure of a photosensitive resin layer 34 (see FIG. 7F) to be described later, irradiated light is capable of passing through the insulative substrate 62 with a light intensity with which the light is capable of exposing the photosensitive resin layer 34 formed on the insulative substrate 62 in its entirety in the advancing direction of the light.

Figure 6F:
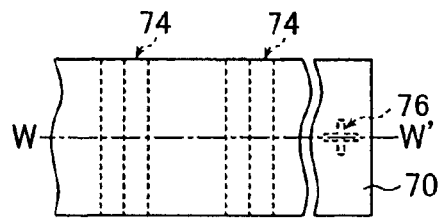
Figure 6B:
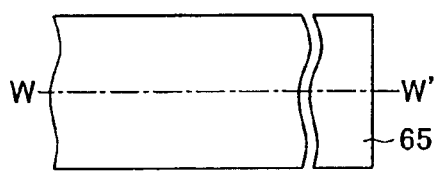
Figure 6G:
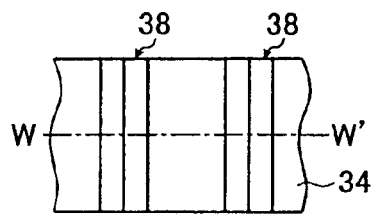
Figure 6C:
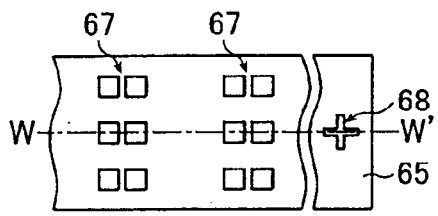

Then, as shown in FIGS. 6C and 7C, rectangular-shaped opening patterns 67 are formed at predetermined positions of the resist layer 65 using photolithography. Following this, with Cr-dedicated etchant, for instance, the light-shielding layer 64 is etched in accordance with the opening patterns 67. At this time, an alignment key mark 68 is simultaneously etched and formed at one position or more outside an ink ejection head production region on a surface of the light-shielding layer 64.

Figure 6H:
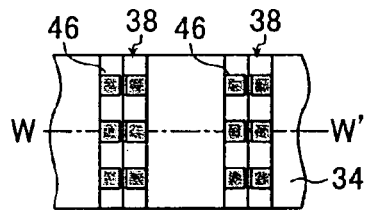
Figure 6D:
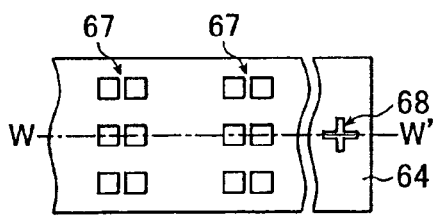

Next, as shown in FIGS. 6D and 7D, the resist layer 65 is removed using a release liquid and a mask substrate 60 is obtained in which the light-shielding layer 64 having the opening patterns 67 and the key mark 68 is formed.

Figure 6I:
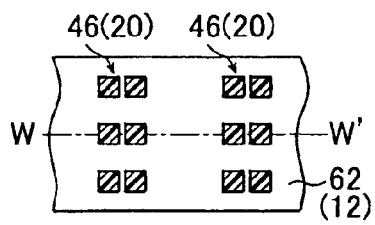
Figure 6E:
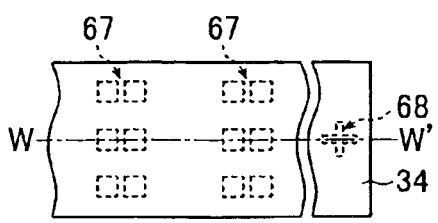

Next, as shown in FIGS. 6E and 7E, a photosensitive resin material, such as NANO SU-8 manufactured by MicroChem Corp., is applied onto a surface of the mask substrate 60 with a spin coat method so as to form a film having a thickness of $h_3$ or more. Following this, the whole of the product is heated to a temperature, e.g., 50 to 90° C. or higher, using a hot plate or a clean oven and a solvent is removed. As a result, the photosensitive resin layer 34 that is a thick film is formed. The following description will be made by assuming that the photosensitive resin material used in this embodiment is a negative-type resist where each exposed portion is cross-linked.

Next, as shown in FIGS. 6F and 7F, a spacer 36 having a height $h_2$ is arranged in a peripheral portion of the mask substrate 60. After that, a substrate mold member 70 having V-groove shaped concave portions 74 in its surface with a depth of $h_1$ (see FIG. 10A) is arranged on the photosensitive resin layer 34 so that the concave portions 74 oppose a surface of the photosensitive resin layer 34. As shown in FIG. 10A, the substrate mold member 70 used in this embodiment has a construction where the release layer 75 is formed on a surface of the mold substrate 72 on which the concave portions 74 have been formed through anisotropic etching of a surface of an Si single crystal substrate. Note that in addition to the V-groove shaped concave portions 74, a desired alignment target formation mark 76 is formed at at least one predetermined position on the substrate mold member 70 and is also transferred onto the surface of the photosensitive resin layer 34 at the time of molding using the substrate mold member 70. When the substrate mold member 70 is arranged on the photosensitive resin layer 34, alignment of the alignment key mark 68 formed on the mask substrate 60 and this target formation mark 76 is achieved, and the substrate mold member 70 is arranged so that the V-groove shaped concave portions 74 and the opening patterns 67 of the mask substrate 60 coincide with each other. The substrate mold member 70 used in this embodiment will be described in detail later.

Following this, the mask substrate 60, above which the substrate mold member 70 has been arranged, is set in a hot-press machine and is heated to a temperature, e.g., 50 to 60° C. or higher, that is the transition point of the SU-8 glass, and the substrate mold member 70 and the mask substrate 60 are pressed at a pressure, e.g., 0.1 MPa or higher, while deaerating the gap between the substrate mold member 70 and the photosensitive resin layer 34 using a vacuum pump. At this time, the distance between the substrate mold member 70 and the mask substrate 60 is regulated by the spacer 36 having the height $h_2$ and a distance from the surface of the insulative substrate 62 to the deepest portion of the V-groove shaped concave portions 74 of the substrate mold member 70 is set to $h_3$. The substrate mold member 70 used in this embodiment will be described in detail later.

Next, as shown in FIGS. 6G and 7G the whole of the product is cooled to room temperature, the substrate mold member 70 is detached from the photosensitive resin layer 34, and a photosensitive resin layer 34 provided with convex portions 38 having a triangular cross-sectional shape with a height $h_1$ is formed on its surface.

Next, as shown in FIGS. 6H and 7H, ultraviolet rays having a wavelength of 350 to 400 nm are vertically irradiated onto the mask substrate 60 from a surface of the mask substrate 60 opposite to a surface thereof on which the photosensitive resin layer 34 has been formed, and exposed portions 46 are obtained so as to correspond to the opening patterns 55. Following this, the whole of the product is heated to a temperature, e.g., 50 to 90° C. or higher, using a hot plate or a clean oven. Then, the mask substrate 60 is cut into a predetermined size of the liquid ejection head together with the photosensitive resin layer 34 including the exposed portions 46 through dicing or the like.

Following this, as shown in FIGS. 6I and 7I, the cut mask substrate 60 is immersed in a developing liquid. After each unexposed portion of the photosensitive resin layer is dissolved, the whole of the product is cleaned through pure water rinsing and the developing liquid is removed. Then, the exposed portions 46 are subjected to hardening processing at a temperature, e.g., 100 to 200° C., and the ink guide members 20 are obtained. Following this, the whole of the product is immersed in a Cr-dedicated etchant or the like and the light-shielding layer 64 on the surface of the mask substrate 60 is removed.

As a result of the steps described above, the sharp-pointed portions 24 having the height $h_1$ are provided at the tip ends of the ink guide members 20 on the insulative substrate 62 (head substrate 12) and a construction member is obtained in which the multiple ink guide members 20 having a high aspect ratio (where the overall height including the sharp-pointed portions 24 becomes the height $h_3$) are arranged on the head substrate 12.

Following this, like in the first embodiment, an ink ejection head is produced by placing the upper cover 14 and the counter electrode 17, on which the recording medium 19 is arranged, above the head substrate 12, on which the ink guide members 20 have been formed, as shown in FIG. 1. Note that in this embodiment, the light-shielding layer 64 is removed through etching, although there occurs no problem even if the ink ejection head is produced without removing the light-shielding layer 64 and by arranging the upper cover 14 and the counter electrode 17, on which the recording medium 15 is arranged, under a state where the light-shielding layer 64 is left.

The production method for the ink ejection head 1 according to the present invention may be as follows.

FIGS. 8A to 8F and FIGS. 9A to 9F are explanatory diagrams of an ink guide member production method that is a third embodiment of the ink ejection head production method of the present invention. FIGS. 8A to 8F are plan views taken from above a substrate surface of the insulative substrate on which the ink guide members are to be produced. Also, FIGS. 9A to 9F are cross-sectional views taken along the line X–X' in FIGS. 8A to 8F, containing the insulative substrate during production, and each corresponding to one of FIGS. 8A to 8F.

Figure 8A:
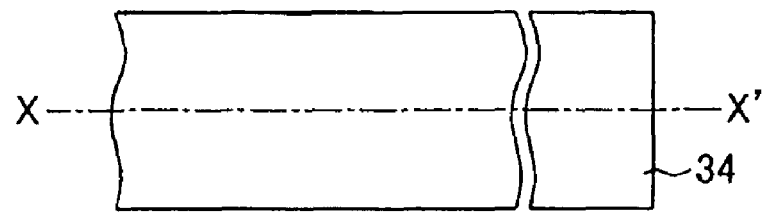
FIGS. 8A to 8F are explanatory diagrams of an ink guide member production method that is a third embodiment of the ink ejection head production method according to the present invention.
Figure 9A:
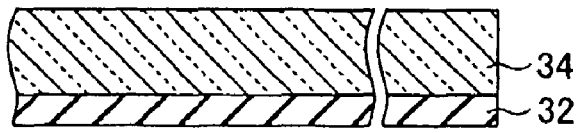
FIGS. 9A to 9F are explanatory diagrams of the ink guide member production method that is the third embodiment of the ink ejection head production method according to the present invention, and are respectively cross-sectional views as viewed from a direction that is different from that in FIGS. 8A to 8F.

First, as shown in FIG. 9A, the insulative substrate 32, such as a glass substrate, is prepared and similarly to the first embodiment, a photosensitive resin material, such as NANO SU-8 manufactured by MicroChem Corp., is used to form a photosensitive resin layer 34 that is a thick film as shown in FIGS. 8A and 9A. The following description will be made by assuming that the photosensitive resin material used in this embodiment is a negative-type resist where each exposed portion is cross-linked.

Figure 8B:
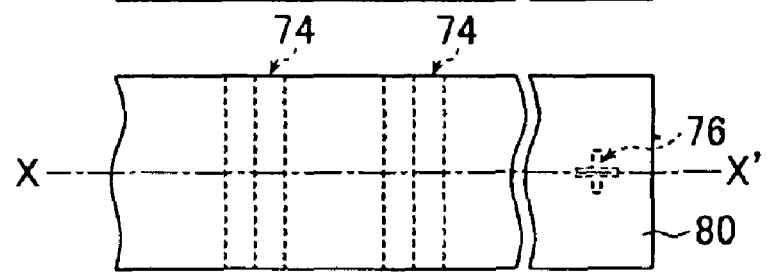
Figure 9B:
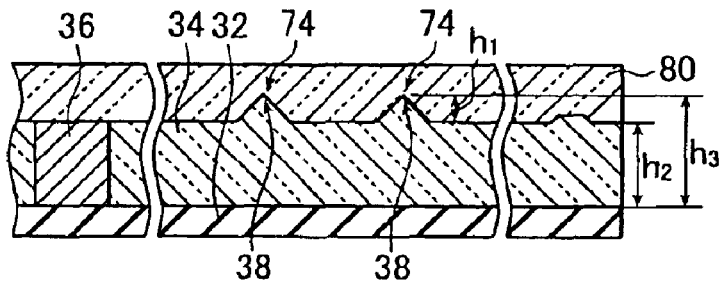

Next, as shown in FIGS. 8B and 9B, the spacer 36 having a height $h_2$ is arranged in a peripheral portion of the substrate and a film mold member 80 that is a mold member having V-groove shaped concave portions 74 with a depth of $h_1$ (see FIG. 10A) is arranged on the photosensitive resin layer 34 so that the concave portions 74 oppose the photosensitive resin layer 34. As shown in FIG. 10A, the film mold member 80 used in this embodiment has a construction where the release layer 75 is formed on a surface of the mold film 82 (see FIGS. 13E and 14E) on which the V-groove shaped concave portions 74 corresponding to the convex portions 38 have been formed on one surface of the resin film having transparency. As in the first embodiment, the surface of the photosensitive resin layer 34 is molded into a convex shape corresponding to the shape of the concave portions 74 of the film mold member 80 with the film mold member 80 being pressed, and the target formation mark 76 of the film mold member 80 is also transferred to the surface of the photosensitive resin layer 34. The film mold member 80 used in this embodiment will be described in detail later. Following this, the whole of the product is cooled to room temperature, and the convex portions 38 having a triangular cross-sectional shape with a height $h_1$ are formed in some areas of the photosensitive resin layer 34 with a thickness of $h_2$. Also, the target mark 63 is formed at at least one position on this surface through the transferring of at least the target formation mark 76 of the film mold member 80.

Figure 8C:
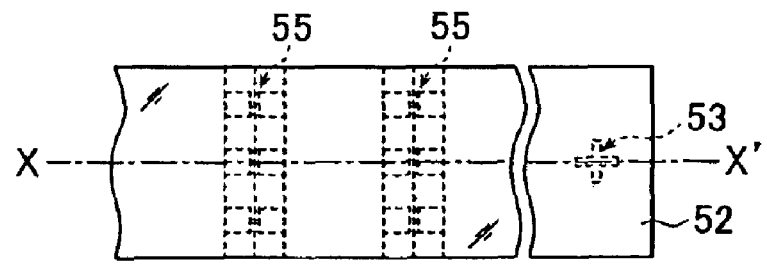
Figure 9C:
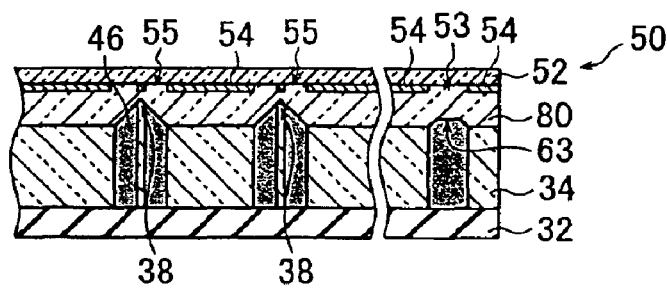

Next, as shown in FIGS. 8C and 9C, the photomask 50 produced by forming the light-shielding layer 54 using Cr or the like on a surface of a transparent glass plate 52 is arranged so that the light-shielding layer 54 and the film mold member 80 are brought into intimate contact with each other. Here, at each predetermined position of the light-shielding layer 54, the opening pattern 55 having a rectangular shape shown in FIG. 4E is formed. Under this state, as in the first embodiment, alignment is performed so that the convex portions 38 produced by molding the photosensitive resin layer 34 and the opening patterns 55 of the photomask coincide with each other. Then, the exposed portions 46 are obtained in accordance with the opening patterns 55. Following this, the whole of the product is heated to a temperature, e.g., 50 to 90° C. or higher, using a hot plate or a clean oven.

Figure 8D:
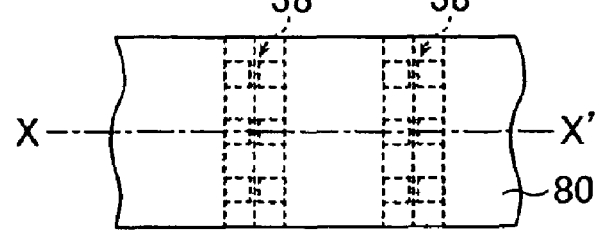
Figure 8E:
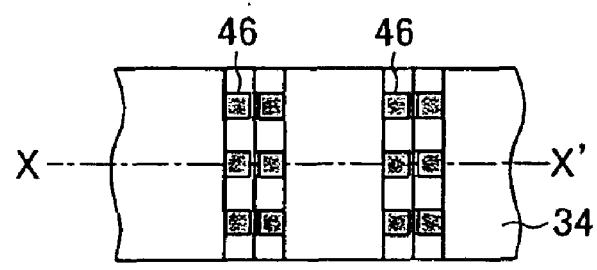
Figure 9D:
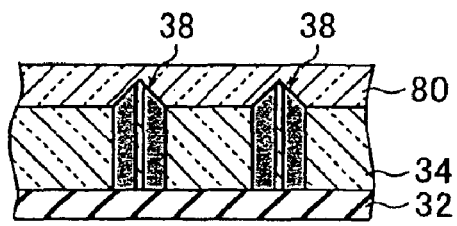
Figure 9E:
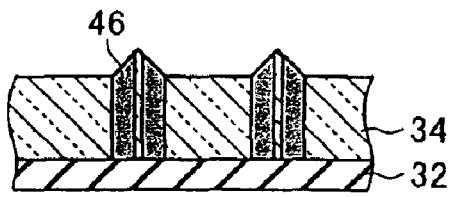

Next, the photomask 50 is removed as shown in FIGS. 8D and 9D, the exposed portions 46 of the photosensitive resin layer 34 are hardened like in the first embodiment, and the film mold member 80 is removed from the surface of the photosensitive resin layer 34 as shown in FIGS. 8E and 9E. Following this, the insulative substrate 32 is cut into a predetermined size of the ink ejection head together with the photosensitive resin layer 34.

Figure 8F:
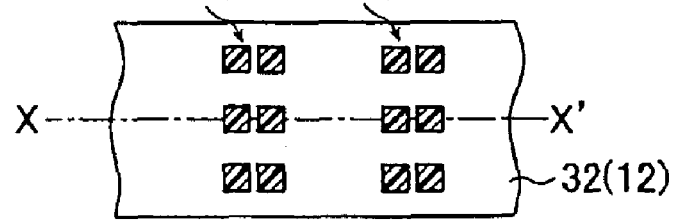
Figure 9F:
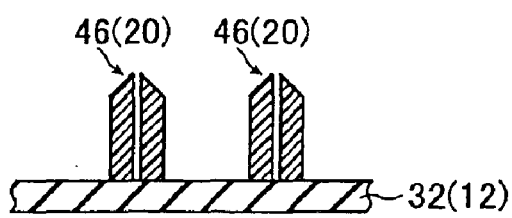

Next, as shown in FIGS. 8F and 9F, like in the first embodiment, the insulative substrate 32 is immersed in a developing liquid together with the photosensitive resin layer 34 and the whole of the product is cleaned through pure water rinsing. Following this, the exposed portions 46 are subjected to hardening processing and the ink guide members 20 are obtained.

As a result of the steps described above, the convex-shaped and sharp-pointed portions 24 having the height $h_1$ are provided at the tip ends of the ink guide members 20 on the insulative substrate 32 (head substrate 12) and a construction member is obtained in which the multiple ink guide members 20 having a high aspect ratio (where the overall height including the sharp-pointed portions 24 becomes the height $h_3$) are arranged on the head substrate 12.

Following this, like in the first embodiment, an ink ejection head is produced by placing the upper cover 14 and the counter electrode 17, on which the recording medium 19 is arranged, above the head substrate 12, on which the ink guide members 20 have been formed, as shown in FIG. 1.

In the first to third embodiments, a negative-type resist is used as the photosensitive resin material, but the photosensitive resin material may be a positive-type resist. In this case, unlike in this embodiment, the ink guide members are formed at desired positions and in a desired shape by light-shielding regions of the photosensitive resin layer 34 that will become the ink guide members and exposing portions of the photosensitive resin layer 34 other than the regions.

Next, the substrate mold member 70 and the film mold member 80 that are each a mold member used in the first to third embodiments will be described in detail.

The substrate mold member 70 and the film mold member 80 have approximately the same shape and construction. FIG. 10A is a schematic construction diagram showing an example of the substrate mold member 70 and the film mold member 80 used with the ink ejection head production method of the present invention.

The substrate mold member 70 has a construction where the release layer 75 made of a fluoride resin or the like is formed on a first surface of the mold substrate 72 that is a surface on an upper side in FIG. 10A. The film mold member 80 has approximately the same shape as the substrate mold member 70 and has a construction where the release layer 75 made of a fluoride resin or the like is formed on a first surface of the mold film 82 that is a surface on the upper side in FIG. 10A like in the case of the substrate mold member 70.

The mold substrate 72 is a p-type Si single crystal substrate whose surface is a (100) crystalline plane. Also, multiple V-grooves, whose deepest portions have a depth of $h_1$ from the substrate surface and whose inclined surfaces are each a (111) crystalline plane, are formed on the first surface of the mold substrate 72 with high precision. Further, on the substrate surface, the alignment target formation mark 76 is formed at at least one predetermined position. On the other hand, the mold film 82 is a resin film having transparency and the first surface of the mold film 82 has approximately the same shape as the first surface of the mold substrate 72.

The production methods for the mold substrate 72 and the mold film 82 are described in detail below.

FIGS. 11A to 11E and FIGS. 12A to 12E are each an explanatory diagram of the mold substrate production method of the present invention. FIGS. 11A to 11E are plan views taken from above a first surface of the mold substrate. Also, FIGS. 12A to 12E are cross-sectional views taken along the line Y–Y' in FIGS. 11A to 11E, each corresponding to one of FIGS. 11A to 11E.

Figure 11A:
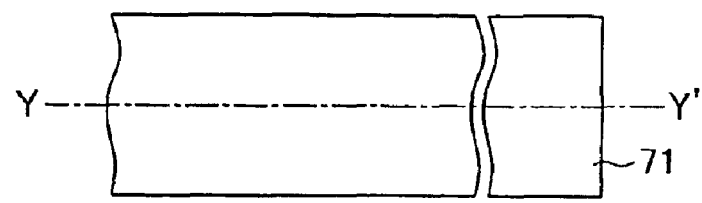
FIGS. 11A to 11E are explanatory diagrams of a mold substrate production method according to the present invention.
Figure 11B:
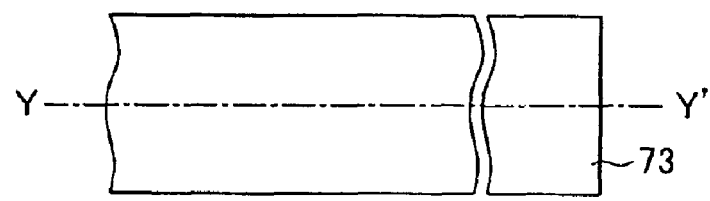
Figure 12A:
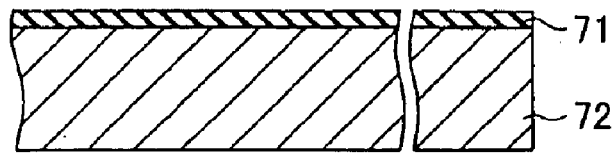
FIGS. 12A to 12E are explanatory diagrams of the mold substrate production method according to the present invention, and are respectively cross-sectional views as viewed from a direction that is different from that in FIGS. 11A to 11E.
Figure 12B:
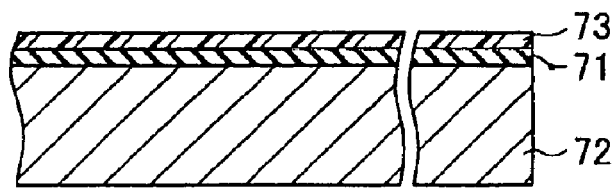

First, as shown in FIGS. 11A and 12A, a thermal oxidation layer 71 is formed through dry oxidation or the like on a surface of the Si single crystal substrate 72 that is a p-type (100) crystalline plane. Following this, as shown in FIGS. 11B and 12B, a resist layer 73 is applied onto the thermal oxidation layer 71 with a spin coat method or the like.

Figure 11C:
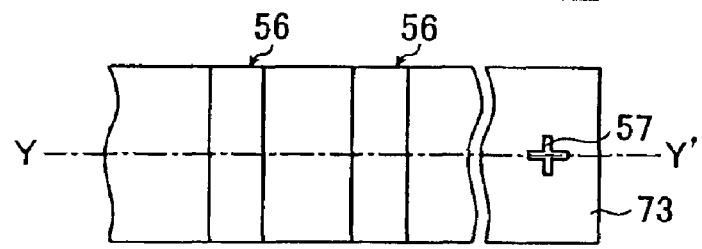
Figure 12C:
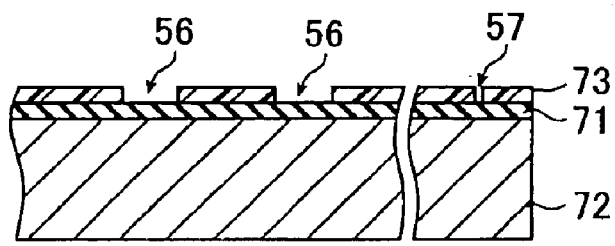

Next, as shown in FIGS. 11C and 12C, the resist layer 73 is exposed/developed, thereby forming groove-shaped resist opening patterns 56 and a cross-shaped resist opening pattern 57.

Figure 11D:
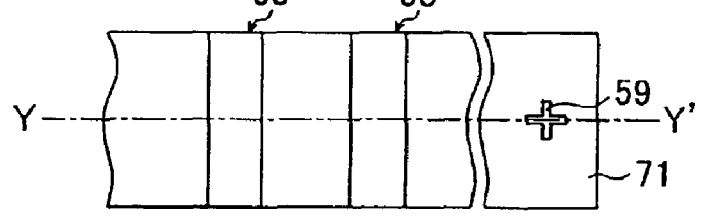
Figure 12D:
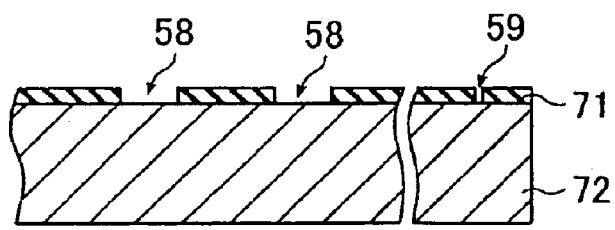

Then, as shown in FIGS. 11D and 12D, the thermal oxidation layer 71 is dry-etched using a reactive ion etching apparatus (RIE apparatus) or the like in order to form groove-shaped oxidation film opening patterns 58 and a cross-shaped oxidation film opening pattern 59, and the resist is removed.

Figure 11E:
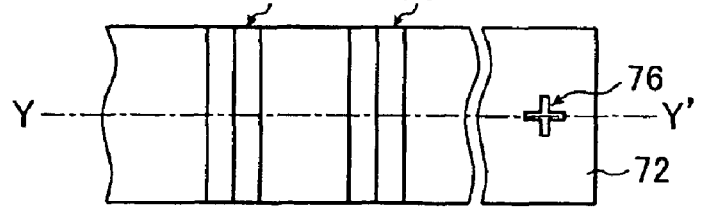
Figure 12E:
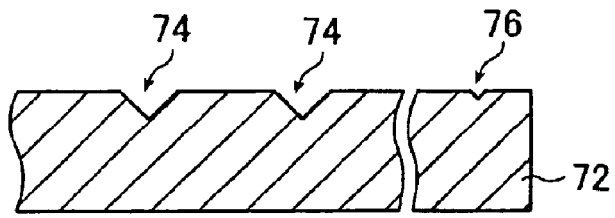

Next, as shown in FIGS. 11E and 12E, anisotropic etching is performed using a 30 wt % solution of KOH in water or the like by setting the thermal oxidation layer 71 having the oxidation film opening patterns 58 and the cross-shaped oxidation film opening pattern 59 as an etching mask. Following this, the oxide film layer 71 is removed. With the method described above, there is produced the mold substrate 72 having a construction where the concave portions 74, which each have inclined surfaces (which are each a (111) crystalline plane) and have a cross section in a V-groove shape, and the target formation mark 76 have been formed on the first surface of the mold substrate 72.

The mold substrate 72 produced with the method described above is given the V-groove shaped concave portions 74 formed with high precision of shape and arrangement through anisotropic etching using the opening patterns 58 shaped and arranged with high accuracy through photolithography and dry etching. As shown in FIG. 10A, a fluororesin coating material or the like is sprayed onto the surface of the mold substrate 72, thereby forming the release layer 75 and producing the substrate mold member 70.

By pressing this substrate mold member 70 against the photosensitive resin layer 34 in the manner described in the first and second embodiments, it becomes possible to form the convex portions 38, which each has high precision of arrangement and shape, a height $h_1$, and a cross section in a triangular shape, on the surface of the photosensitive resin layer 34 with high density and high precision.

In the above description, there is used the production method utilizing the Si single crystal anisotropic etching, although the mold substrate production method is not limited to this. For instance, it is also possible to produce the mold substrate in an arbitrary shape through micro discharge processing or ultrasonic processing. It is preferable, however, that the mold substrate is produced using the Si single crystal anisotropic etching because it is possible to form a lot of concave portions at one time so as to be positioned with high density and high precision and have a highly precise shape in this case.

Next, the production method for the mold film 82 using the mold substrate 72 will be described.

FIGS. 13A to 13E are explanatory schematic plan views for the steps of the mold film production method of the present invention. FIGS. 14A to 14E are plan views taken from above a first surface of the mold film. Also, FIGS. 13A to 13E are schematic cross-sectional views taken along the line Z–Z' in FIGS. 14A to 14E, each corresponding to one of FIGS. 14A to 14E.

Figure 13A:
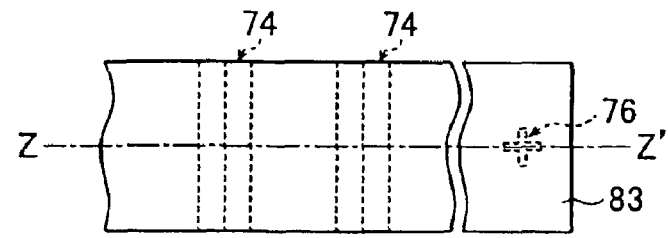
FIGS. 13A to 13E are explanatory diagrams of a mold film production method according to the present invention.
Figure 13B:
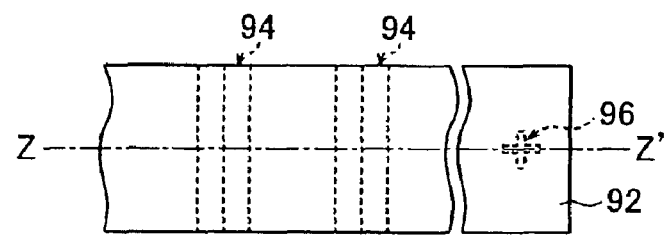
Figure 13C:
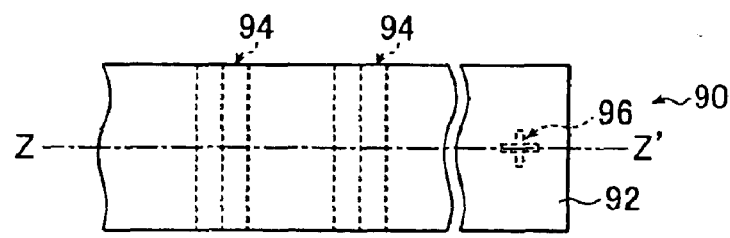
Figure 13D:
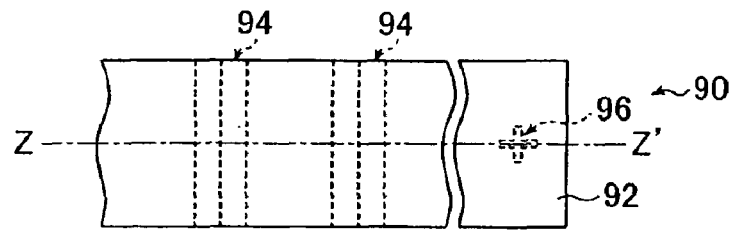
Figure 14A:
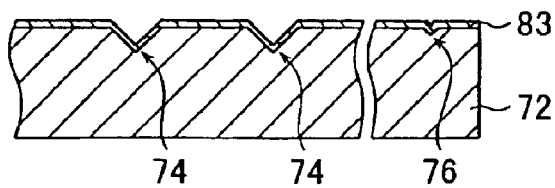
FIGS. 14A to 14E are explanatory diagrams of the mold film production method according to the present invention, and are respectively cross-sectional views as viewed from a direction that is different from that in FIGS. 13A to 13E.
Figure 14B:
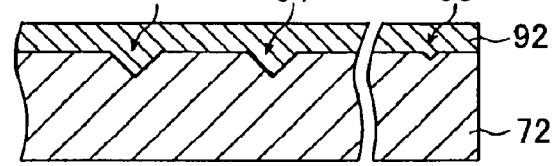
Figure 14C:
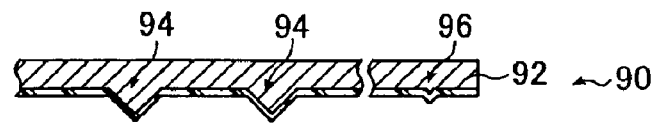
Figure 14D:
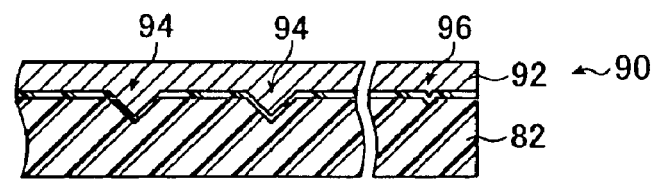

First, as shown in FIGS. 13A and 14A, Ni or the like is vapor-deposited on a surface of the mold substrate 72 produced with the production method described above that utilizes the Si single crystal anisotropic etching, thereby forming a metal layer 83. Next, as shown in FIGS. 13B and 14B, Ni is electoformed using the metal layer 83 as a seed layer and a mother mold substrate 92 made of Ni is produced. The mother mold substrate 92 produced in this manner has a construction shown in FIGS. 13C and 14C where convex portions 94 having a shape corresponding to the concave portions 74 on the surface of the mold substrate 72 and a convex portion 96 having a shape corresponding to the concave portion 76 have been formed on a surface of the mother mold substrate 92.

The mother mold substrate 92 is detached from the mold substrate 72 and a fluororesin coating material or the like is sprayed onto the surface of the mold substrate 72, thereby obtaining a mother mold member 90 having the convex portions 94 with a height $h_1$ and a cross section in a triangular shape.

Figure 13E:
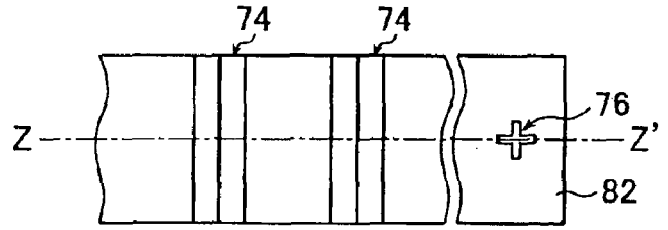
Figure 14E:
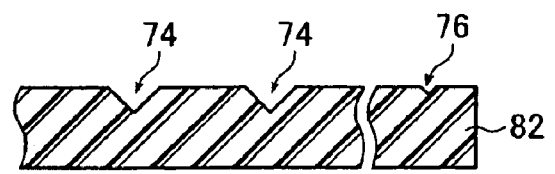

An ultraviolet ray hardening resin is applied onto a surface of the mother mold member 90 so as to form a film having a thickness, e.g., 30 to 100 μm. Then, hardening is performed by irradiating the entire surface of the film with ultraviolet rays and the film is released from the mother mold member 90. As a result, as shown in FIGS. 13E and 14E, the mold film 82 is obtained whose first surface has a shape that is approximately the same as that of the mold substrate 72. This mold film 82 is spray-coated with a fluororesin or the like, thereby forming the release layer 75 and producing the film mold member 80.

The first surface of the film mold member 80 produced with the method described above has substantially the same construction of the substrate mold member 70 having the V-groove shaped concave portions 74 formed with high precision of shape and arrangement. The concave portions 74 are obtained by anisotropic etching.

By pressing this film mold member 70 against the photosensitive resin layer 34 in the manner described in the third embodiment, it becomes possible to form the convex portions 38, which each has high precision of arrangement and shape, a height $h_1$, and a cross section in a triangular shape, on the surface of the photosensitive resin layer 34 with high density and high precision.

With the method described above, the mold film 82 is produced by applying the ultraviolet ray hardening resin onto the surface of the mother mold member 90 and hardening the applied resin, although the present invention is not limited to this. For instance, it is also possible to produce the mold film by molding a resin surface using the mother mold member 90 with a publicly known technique such as injection molding or embossing.

Also, when this film mold member 80 is applied to the production of the ink guide members, the mold film 82 is a resin film and the film mold member 80 has flexibility, so that there is obtained an advantage that it is possible to suppress the deformation of the photosensitive resin layer 34 at the time of releasing of the film mold member 80 from the photosensitive resin layer 34 and to prevent the breakage of the photosensitive resin layer 34 at the time of the releasing of the film mold member 80 from the photosensitive resin layer 34. Also, even if the matching oil layer is not formed, it is possible to suppress the refraction or diffraction of light for exposing the photosensitive resin layer and to produce the ink guide members having a highly accurate shape with less process steps. Also, the mold film 82 is formed by transferring the surface shape of the mother mold member 90, so that there is obtained an advantage that it is possible to duplicate the mold film 82 having the same shape at low cost and to increase the productivity of the ink jet head.

In the first to third embodiments, a member produced by forming the release layer 75 on the surface of the mold substrate 72 or the mold film 82 is used as the mold member. In the present invention, however, the mold substrate 72 and the mold film 82 may be used as the mold member without forming the release layer on the surface of the mold substrate 72 and the mold film 82. In this case, however, at the time of the releasing of the mold member from the photosensitive resin layer 34, there occurs a situation where it is impossible to perform the releasing because the photosensitive resin material adheres to the surface of the mold member or a defect shape is formed because the releasing is performed under a state where the photosensitive resin partially adheres to the mold. In view of these problems, it is preferable that the release layer is formed on the surface of the mold member because it becomes possible to perform the releasing with ease and to suppress the formation of the defect shape due to a release failure with more reliability.

Figure 10B:
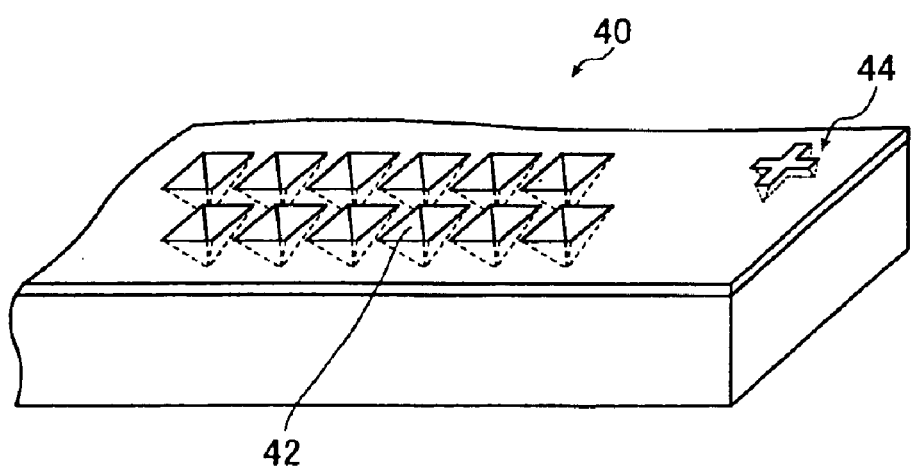
Figure 15:
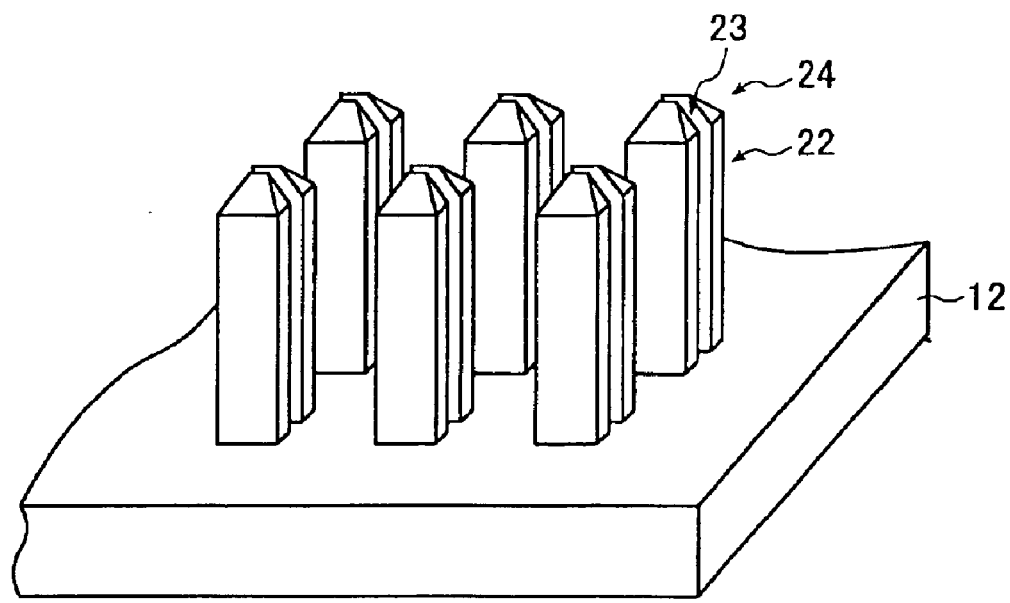
FIG. 15 is a schematic perspective view of another shape of the solution guide member produced according to the present invention.

It should be noted here that the substrate mold member 70 and the film mold member 80 each have a shape where there have been formed the multiple concave portions whose inclined surface are each a (111) crystalline plane and cross sections each have a V-groove shape as shown in FIG. 10A. As to the mold member used in the present invention, however, the pattern used in the photolithography step of the production of the mold substrate 72 may be changed so as to have a rectangular shape, for instance. In this case, a mold member 40 is obtained which has a construction where multiple inverted-pyramid shaped concave portions 42, whose inclined surfaces are each a (111) crystalline plane, are arranged with high density as shown in FIG. 10B. When this mold member 40 is used, the ink guide members 20 formed according to the first and second embodiments described above are each given a sharp-pointed portion 24 having a pyramid shape shown in FIG. 15.

Figure 16A:
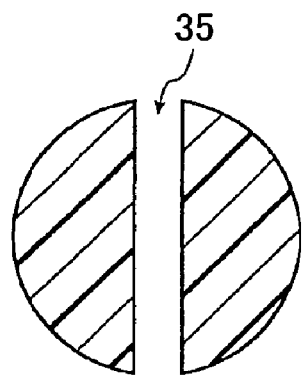
FIGS. 16A and 16B are schematic plan views of still another shape of the solution guide member produced according to the present invention.
Figure 16B:
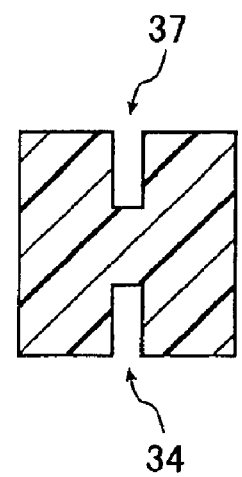
Figure 17:
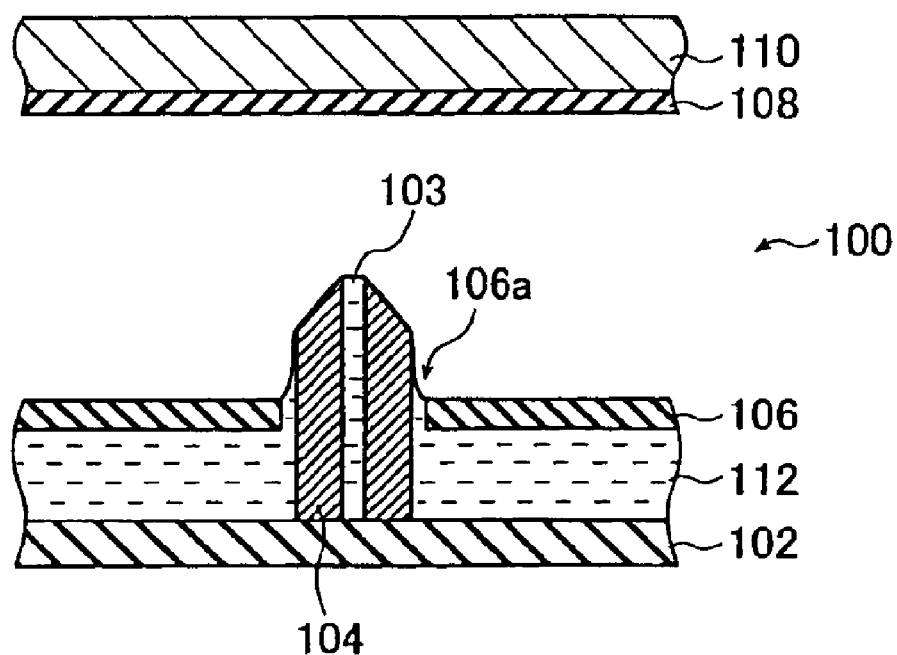
FIG. 17 is a schematic structural diagram of an example of an ink ejection device in a conventional image recording apparatus.
Figure 18A:
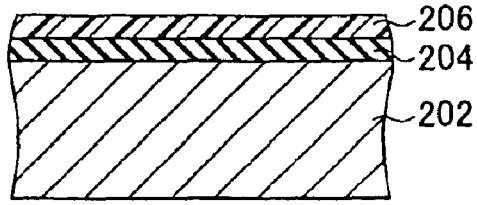
FIGS. 18A to 18G are explanatory diagrams of a step of an example of a conventional ink ejection head production method.
Figure 18B:
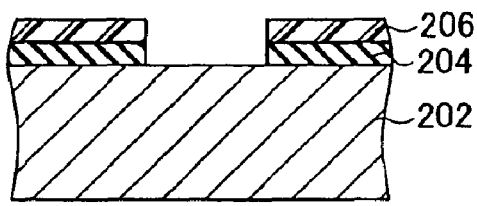
Figure 18C:
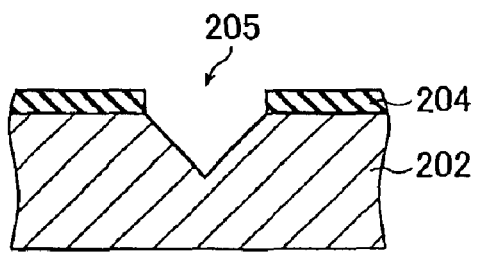
Figure 18D:
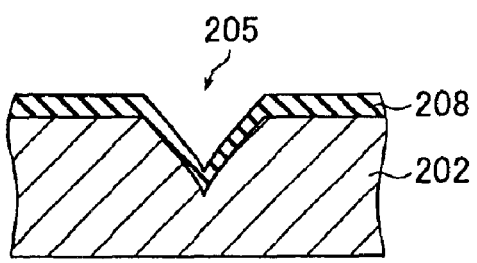
Figure 18E:
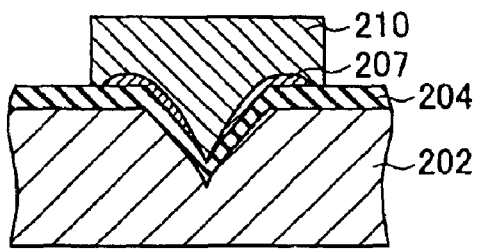
Figure 18F:
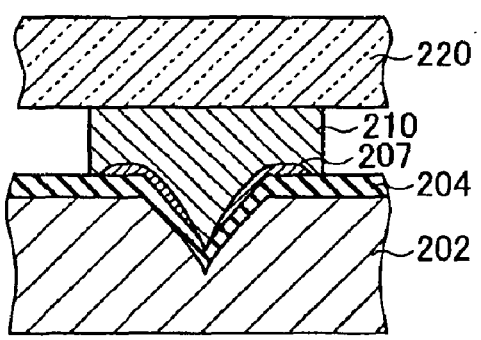
Figure 18G:
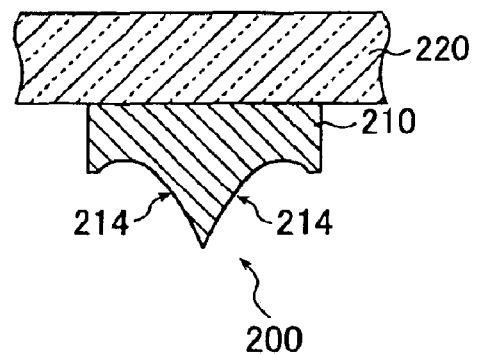

Also, in the first to third embodiments, an exposure pattern for exposing the photosensitive resin layer, that is, a pattern for forming the respective cross-sectional shapes of the ink guide members 20 is set as a pattern in which rectangles are formed so as to oppose each other at predetermined intervals. However, the pattern used with the production method of the present invention is not limited to this and the shape of the exposure pattern for the photosensitive resin may be arbitrarily changed. In this case, it becomes possible to form the ink guide members 20 in various other shapes such as a shape shown in FIG. 16A that is a cross-sectional view of the ink guide member where an ink guide groove 35 is formed at the center of a circular cross-sectional shape and a shape shown in FIG. 16B where the cross-sectional shape is rectangular and ink guide grooves 34, 37 are formed through partial notching.

Also, in the first to third embodiments, nothing is formed on surfaces of the ink guide members 20 and these members are formed only using a photosensitive resin material. However, the production method according to the present invention is not limited to this and the ink guide members may be each produced by forming a metal or a dielectric film on its surface in a portion that includes at least the sharp-pointed portion of the molded photosensitive resin material with a method such as mask vapor deposition. As a result, it becomes possible to produce a liquid ejection head by appropriately improving durability and electric characteristics.

Also, in the ink ejection head 1 produced in the embodiments described above, a voltage is applied to the drive electrode 16 provided around the upper cover through holes 14a, through which a desired ink guide member 20 passes, and an electric field is generated between the drive electrode 16 and the counter electrode 17, although the ink ejection head produced according to the present invention is not limited to this. For instance, an electric conductor film may be formed so as to coat the surface of each ink guide member without providing the drive electrode 16. In this case, the charged particles may be ejected toward the counter electrode 17 by means of an electric field formed between the sharp-pointed portion 24 and the counter electrode 17 through direct application of a voltage to the electric conductor film. Even in this case, the ink guide member 20 is sharply pointed in its tip end and is thus given the sharp-pointed portion 24, so that it becomes possible to generate an electric field concentrated at the sharp-pointed portion 24 and to eject the charged particles from the sharp-pointed portion 24 as a small droplet with stability.

Also, the liquid ejection head produced according to the present invention is not limited to a head involving the ejection of ink containing coloring material particles and may be applied to heads using any other kind of solution so long as the solution contains charged particles dispersed in a solvent.

The fundamentals of the ink ejection head production method of the present invention have been described above. The ink ejection head production method has been described in detail above, although the present invention is not limited to the embodiments described above and it is of course possible to make various modifications and changes without departing from the gist of the present invention.

As described above, according to the present invention, solution guide members are formed by forming a photosensitive resin layer on a head substrate, forming convex portions that are each a sharp-pointed extreme tip end portion on a surface of the photosensitive resin layer by pressing a separately produced mold substrate against a surface of the photosensitive resin layer, and partially exposing and developing the photosensitive resin layer so that regions containing the convex portions are left as a part of the solution guide members. Therefore, it becomes possible to arrange and form the solution guide members whose tip ends are the sharp-pointed portions molded with the mold substrate at a high aspect ratio and with high density and high precision as compared with a conventional liquid ejection head production method. As a result, it becomes possible to produce a liquid ejection head that is capable of causing a solution to fly as a small droplet with high density and high precision as compared with a conventional case. Also, it is possible to simplify the process steps and to suppress the formation of the defect shape of the solution guide members as compared with the conventional production method. Therefore, it becomes possible to produce the liquid ejection head with high productivity as compared with the conventional production method. Also, the solution guide members are formed using a photolithography method, so that it also becomes possible to freely design the cross-sectional shape of the solution guide members and to produce solution guide members having various shapes. Therefore, it becomes possible to produce the liquid ejection head by selecting the shape of the solution guide members in accordance with the application purpose of the liquid ejection head and the characteristics of a solution to be ejected.

It should be noted here that the mold substrate produced through the anisotropic etching utilizing semiconductor processing is used as the mold member. Therefore, it is possible to produce the concave portions corresponding to the sharp-pointed portions of the solution guide members on the surface of the mold substrate with high precision of shape and arrangement without variations. Consequently, it becomes possible to form the sharp-pointed portions of the tip ends of the solution guide members through the pressing of the mold substrate with high precision of shape and arrangement without variations. As a result, it becomes possible to produce a liquid ejection head that is capable of ejecting droplets with high uniformity, high precision, and stability.

It should be noted here that when predetermined portions of the photosensitive resin layer are exposed by irradiating the photosensitive resin layer with light from a surface side of the photosensitive resin layer on which the convex portions have been formed, the material of the head substrate is not specifically limited so long as a flat substrate is obtained. Also, various kinds of processing, such as wiring, may be performed on the surface of the substrate. Therefore, it becomes possible to produce the liquid ejection head by selecting the material of the head substrate and the kind of processing performed on the substrate in accordance with the application purpose of the liquid ejection head and the characteristics of a solution to be ejected.

Also, by forming the matching oil layer on the surface of the photosensitive resin layer and partially exposing the photosensitive resin layer by bringing the exposure mask having a predetermined pattern shape into intimate contact with the matching oil layer, there is prevented the occurrence of refraction, diffraction, and the like of light on a surface portion of the exposure mask or the photosensitive resin layer, which suppresses the defect shape of the photosensitive resin layer surface portion. Therefore, it becomes possible to produce the solution guide members with high precision of shape. As a result, it becomes possible to produce a liquid ejection head that is capable of ejecting a droplet with high uniformity, high precision, and stability.

Further, according to the present invention, the photosensitive resin layer is exposed through the head substrate from a surface of the head substrate on a side opposite to a surface thereof on which the photosensitive resin layer has been formed. Therefore, there is prevented the occurrence of refraction, diffraction, and the like of light incident on the photosensitive resin layer without using a matching oil and it becomes possible to produce the solution guide members with high precision of shape. As a result, it becomes possible to produce, with high productivity, a liquid ejection head that is capable of ejecting droplets with high uniformity, high precision, and stability.

Also, the mold film made of a resin film and provided with concave portions on its surface is used as the mold member, so that it becomes possible to form a mold member having flexibility. With such a mold member having flexibility, there is suppressed the deformation of the photosensitive resin layer at the time of releasing of the mold member from a surface of the photosensitive resin layer, which makes it possible to prevent the breakage of the photosensitive resin layer. Therefore, it becomes possible to produce the solution guide members with high precision of shape and stability. As a result, it becomes possible to produce, with high productivity, a liquid ejection head that is capable of ejecting droplets with high uniformity, high precision, and stability.

Also, the exposure of the photosensitive resin layer is performed by irradiating the photosensitive resin layer with light through the mold film, so that it becomes possible to suppress the refraction and diffraction of light exposing the photosensitive resin layer without forming a matching oil layer. Also, as described above, it also becomes possible to suppress the breakage of the photosensitive resin layer at the time of releasing of the mold film from the photosensitive resin layer. Therefore, it becomes possible to produce the solution guide members with high precision of shape and stability. As a result, it becomes possible to produce, with high productivity, a liquid ejection head that is capable of ejecting droplets with high uniformity, high precision, and stability.

What is claimed is:

1. A method of producing a liquid ejection head including a solution guide member that is a protrusion member provided on a head substrate and has a tip end that is a sharp-pointed portion protruding from a liquid surface of a solution in which charged particles are dispersed and which flows on the head substrate, the solution guide member guiding the solution to the sharp-pointed portion such that the solution is ejected from the sharp-pointed portion by means of an electrostatic force, the method comprising:

forming a photosensitive resin layer on the head substrate;

molding a convex portion having the sharp-pointed portion on a surface of the formed photosensitive resin layer by pressing a mold member against the surface of the photosensitive resin layer;

exposing one of a first region and a second region of the photosensitive resin layer by irradiation of light wherein the first region includes a region in which the convex portion has been molded and the second region includes a peripheral region surrounding the region of the molded convex portion; and developing the exposed photosensitive resin layer to produce the solution guide member provided on the head substrate.

2. The method of producing a liquid ejection head according to claim 1, wherein the mold member comprises a mold substrate produced by forming a concave portion corresponding to the convex portion on a surface of a single crystal substrate, the concave portion obtained by anisotropic etching.

3. The method of producing a liquid ejection head according to claim 1, wherein the exposure of the photosensitive resin layer is performed by irradiating the photosensitive resin layer with light from a side on which the mold member is pressed against the photosensitive resin layer and the convex portion is molded.

4. The method of producing a liquid ejection head according to claim 3, wherein the exposure of the photosensitive resin layer is performed by forming a matching oil layer on a surface of the photosensitive resin layer and bringing an exposure mask having a predetermined pattern shape into contact with the matching oil layer.

5. The method of producing a liquid ejection head according to claim 1, wherein:

the mold member against the surface of the photosensitive resin layer has V-groove shaped concave on a surface of the mold member.

6. The method of producing a liquid ejection head according to claim 5, wherein:

the exposure of the photosensitive resin layer is performed using an exposure mask which is formed on the head substrate.

7. The method of producing a liquid ejection head according to claim 1, wherein:

the head substrate has transparency; and the exposure of the photosensitive resin layer is performed by irradiating the photosensitive resin layer with light through the head substrate from a surface of the head substrate on a side opposite to a surface thereof on which the photosensitive resin layer has been formed.

8. The method of producing a liquid ejection head according to claim 1, wherein the mold member comprises a mold film that is a resin film having a surface on which a concave portion corresponding to the convex portion has been formed.

9. The method of producing a liquid ejection head according to claim 8, wherein:

the mold film has transparency; and the exposure of the photosensitive resin layer is performed by irradiating the photosensitive resin layer with light through the mold film in a state where the mold film used to mold the convex portion remains.

10. The method of producing a liquid ejection head according to claim 9, wherein:

the exposure of the photosensitive resin layer is performed using an exposure mask which is disposed on the mold film.

11. The method of producing a liquid ejection head according to claim 1, wherein:

the head substrate has plural solution guide members arrayed two dimensionally thereon and the solution guide members are simultaneously produced through the molding, the exposing and the developing.

* * * * *